US012757350B2

(12) United States Patent
Liu

(10) Patent No.: US 12,757,350 B2
(45) Date of Patent: Oct. 6, 2026

(54) FAN ASSEMBLY, HEAT DISSIPATION ASSEMBLY AND ELECTRONIC DEVICE

(71) Applicant: GIGA-BYTE TECHNOLOGY CO., LTD., New Taipei City (TW)

(72) Inventor: Chia-Yu Liu, New Taipei City (TW)

(73) Assignee: GIGA-BYTE TECHNOLOGY CO., LTD., New Taipei City (TW)

( * ) Notice: Subject to any disclaimer, the term of this patent is extended or adjusted under 35 U.S.C. 154(b) by 246 days.

(21) Appl. No.: 18/658,124

(22) Filed: May 8, 2024

(65) Prior Publication Data

US 2025/0142765 A1 May 1, 2025

(30) Foreign Application Priority Data

Oct. 31, 2023 (TW) ................................ 112141690

(51) Int. Cl.
*H05K 7/20* (2006.01)
*F04D 17/16* (2006.01)
*F04D 29/42* (2006.01)

(52) U.S. Cl.
CPC ......... *H05K 7/20145* (2013.01); *F04D 17/16* (2013.01); *F04D 29/4246* (2013.01)

(58) Field of Classification Search
CPC ........ G06F 1/20; G06F 1/206; F04D 29/4226; F04D 29/4246; F04D 17/16; F04D 29/281; F04D 25/0613; F04D 29/424; F04D 25/08; F04D 25/14; F04D 25/166; F04D 29/282; F04D 29/602; F04D 29/626;

(Continued)

(56) References Cited

U.S. PATENT DOCUMENTS 7,708,521 B2 * 5/2010 Hwang .................. G06F 1/203 415/203
9,388,826 B2 * 7/2016 Liu ......................... F04D 17/04
(Continued)

FOREIGN PATENT DOCUMENTS

CN 116104806 A 5/2023
DE 102006015992 A1 10/2007
TW 1268752 B 12/2006

OTHER PUBLICATIONS

EU Extended European Search Report dated Oct. 21, 2024 in application 24177736.6.

(Continued)

*Primary Examiner* — Michael A Matey
(74) *Attorney, Agent, or Firm* — Maschoff Brennan

(57) ABSTRACT

A fan assembly, a heat dissipation assembly and an electronic device. The fan assembly including a casing, an impeller and an air collecting component. The casing has an inner surface, an inlet and at least two outlets. The inner surface is connected to the two outlets. The inlet is in fluid communication with the two outlets. The inner surface faces the impeller. The air collecting component is disposed in one of the two outlets and having an air collecting surface. The air collecting surface faces the impeller. The air collecting surface is connected to the inner surface. The air collecting surface and the inner surface form a gap together with the impeller. The gap is widened along a rotating direction of the impeller. The air collecting component is configured to guide an airflow blown by the impeller to another outlet via the gap.

10 Claims, 12 Drawing Sheets

(58) Field of Classification Search

CPC .. F04D 29/703; H10W 40/43; F05D 2250/52; H05K 7/20136; H05K 7/20154; H05K 7/20172; H05K 7/20145; H05K 7/20209; F24F 1/0022; F28D 15/0275; H02K 5/20; H02K 5/207; H02K 2211/03

See application file for complete search history.

(56) References Cited

U.S. PATENT DOCUMENTS

| | | | | |
|---|---|---|---|---|
| 2008/0019827 | A1 | 1/2008 | Hirata | |
| 2010/0071875 | A1* | 3/2010 | Hwang | H10W 40/43 415/203 |
| 2012/0111544 | A1* | 5/2012 | Senatori | G06F 1/203 165/121 |
| 2012/0237340 | A1 | 9/2012 | Tsai et al. | |
| 2013/0121816 | A1 | 5/2013 | Tang | |
| 2021/0317844 | A1 | 10/2021 | Chen et al. | |

OTHER PUBLICATIONS

Taiwan Office Action dated 2024-07-02 in application No. 112141690.

* cited by examiner

FAN ASSEMBLY, HEAT DISSIPATION ASSEMBLY AND ELECTRONIC DEVICE

CROSS-REFERENCE TO RELATED APPLICATIONS

This non-provisional application claims priority under 35 U.S.C. § 119 (a) on Patent Application No(s). 112141690 filed in Taiwan, R.O.C. on Oct. 31, 2023, the entire contents of which are hereby incorporated by reference.

TECHNICAL FIELD

The disclosure relates to an air-cooling assembly, more particularly to a fan assembly and a heat dissipation assembly and an electronic device including at least one fan assembly.

BACKGROUND

In order to dissipate a large amount of heat generated by a heat source such as a central processing unit (CPU) or a graphics processing unit (GPU) to the outside, a heat dissipation assembly is usually disposed in a laptop computer. Typically, the heat dissipation assembly includes a heat pipe, a heat sink and a fan. The heat pipe is configured to effectively transfer the heat generated by the heat source to the heat sink. The fan is configured to blow a cooling air to cool the heat sink. With the help of the heat sink having a large surface area, the heat is allowed to be effectively dissipated to the outside of the laptop computer.

However, thinning is a recent trend in the laptop computer. Thus, components are disposed in the laptop computer in a dense manner, which makes the component adjacent to the fan (e.g., heat pipe) inevitably block a part of the outlet of the fan. Accordingly, the cooling efficiency of the fan is unable to be maintained at its original level.

SUMMARY

The disclosure provides a fan assembly, a heat dissipation assembly and an electronic device where an airflow blown by an impeller is guided to another outlet via an air collecting component, thereby maintaining the cooling efficiency of the fan assembly at its original level as much as possible.

One embodiment of this disclosure provides a fan assembly including a casing, an impeller and an air collecting component. The casing has an inner surface, an inlet and at least two outlets. The inner surface is connected to the at least two outlets. The inlet is in fluid communication with the at least two outlets. The impeller is rotatably disposed on the casing. The inner surface faces the impeller. The air collecting component is disposed in one of the at least two outlets and having an air collecting surface. The air collecting surface faces the impeller. The air collecting surface is connected to the inner surface. The air collecting surface and the inner surface form a gap together with the impeller. The gap is widened along a rotating direction of the impeller. The air collecting component is configured to guide an airflow blown by the impeller to another one of the at least two outlets via the gap.

Another embodiment of this disclosure provides a heat dissipation assembly including a fan assembly, at least one heat sink and a disturbing component. The fan assembly includes a casing, an impeller, and an air collecting component. The casing has an inner surface, an inlet and at least two outlets. The inner surface is connected to the at least two outlets. The inlet is in fluid communication with the at least two outlets. The impeller is rotatably disposed on the casing. The inner surface faces the impeller. The air collecting component is disposed in one of the at least two outlets and has an air collecting surface. The air collecting surface faces the impeller. The air collecting surface is connected to the inner surface. The air collecting surface and the inner surface form a gap together with the impeller. The gap is widened along a rotating direction of the impeller. The air collecting component is configured to guide an airflow blown by the impeller to another one of the at least two outlets via the gap. The at least one heat sink is disposed adjacent to one of the at least two outlets. The disturbing component covers at least a part of the outlet where the air collecting component is disposed.

Still another embodiment of this disclosure provides an electronic device including a housing, a motherboard assembly, a fan assembly, at least one heat sink and a disturbing component. The motherboard assembly includes a motherboard and at least one heat source. The motherboard is disposed in the housing. The heat source is disposed on the motherboard. The fan assembly is disposed in the housing and includes a casing, an impeller and an air collecting component. The casing has an inner surface, an inlet and at least two outlets. The inner surface is connected to the at least two outlets. The inlet is in fluid communication with the at least two outlets. The impeller is rotatably disposed on the casing. The inner surface faces the impeller. The air collecting component is disposed in one of the at least two outlets and has an air collecting surface. The air collecting surface faces the impeller. The air collecting surface is connected to the inner surface. The air collecting surface and the inner surface form a gap together with the impeller. The gap is widened along a rotating direction of the impeller. The air collecting component is configured to guide an airflow blown by the impeller to another one of the at least two outlets via the gap. The at least one heat sink is disposed in the housing and disposed adjacent to one of the at least two outlets. The disturbing component is disposed in the housing and covers at least a part of the outlet where the air collecting component is disposed.

According to the fan assembly, the heat dissipation assembly and the electronic device disclosed by above embodiments, since the gap is widened along the rotating direction of the impeller, the air collecting component is allowed to guide the airflow blown by the impeller to another one of the at least two outlets via the gap as much as possible. Accordingly, in a case that the outlet for disposing the air collecting component is inevitably blocked by an adjacent component such as the disturbing component, the air collecting component guides the airflow that is originally blocked by the disturbing component to another outlet as much as possible, thereby maintaining the cooling efficiency of the fan assembly at its original level as much as possible.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
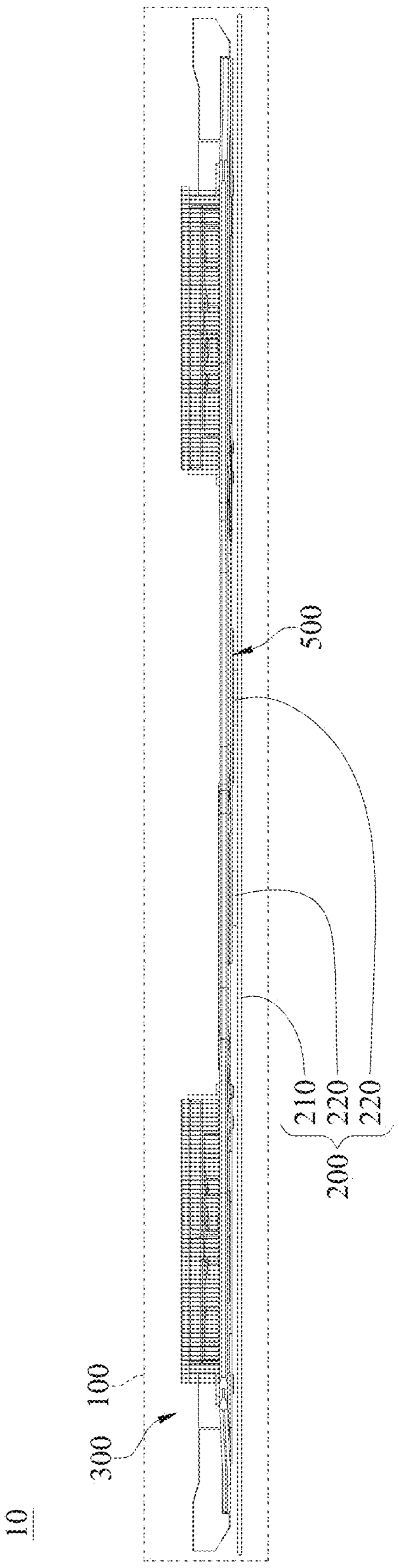
FIG. 1 is a side schematic view of an electronic device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
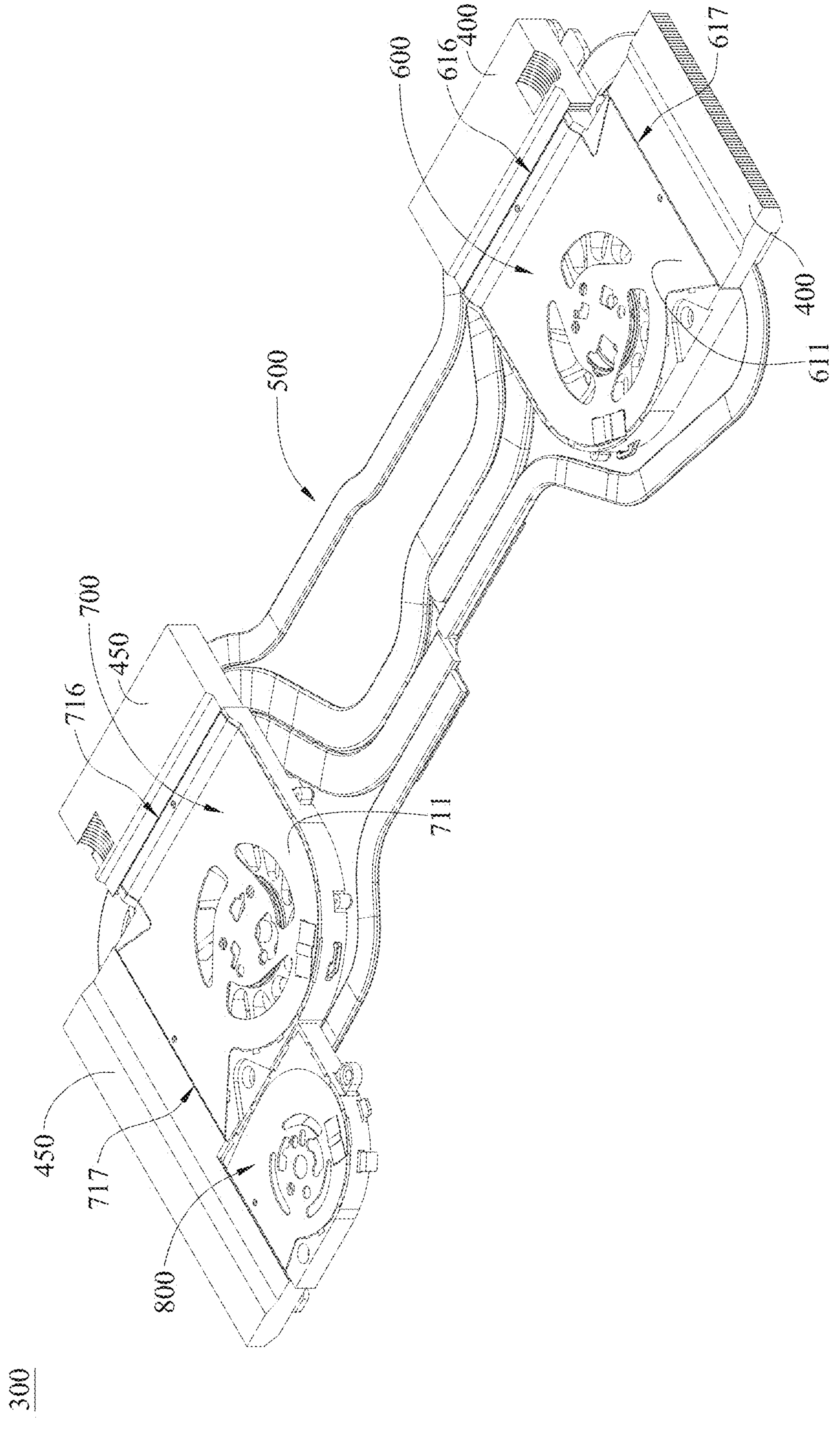
FIG. 2 is a perspective view of a heat dissipation assembly of the electronic device in FIG. 1.

Please refer to FIGS. 1 and 2. FIG. 1 is a side schematic view of an electronic device 10 according to a first embodiment of the disclosure. FIG. 2 is a perspective view of a heat dissipation assembly 300 of the electronic device 10 in FIG. 1.

In this embodiment, the electronic device 10 is, for example, a laptop computer. The electronic device 10 includes a housing 100, a motherboard assembly 200 and the heat dissipation assembly 300. The heat dissipation assembly 300 is disposed in the housing 100, and includes two first heat sinks 400, two second heat sinks 450, a disturbing component 500, a first fan assembly 600 and a second fan assembly 700.

The motherboard assembly 200 includes a motherboard 210 and two heat sources 220. The motherboard 210 is disposed in the housing 100. The heat sources 220 are disposed on and electrically connected to the motherboard 210.

The two first heat sinks 400 and the two second heat sinks 450 are disposed on the motherboard 210. The disturbing component 500 is, for example, a heat pipe assembly. The disturbing component 500 is thermally coupled to the two heat sources 220, the two first heat sinks 400 and the two second heat sinks 450. In some embodiments, the two first heat sinks 400 and the two second heat sinks 450 may be disposed on an arbitrary structure in the housing 100 or the electronic device 10. Alternatively, in some embodiments, the two first heat sinks 400 and the two second heat sinks 450 may merely be in contact with the disturbing component 500 but spaced apart from the housing 100 and the motherboard 210. In addition, in some embodiments, the heat dissipation assembly 300 may merely include one heat sink (i.e., one first heat sink 400 or one second heat sink 450).

Figure 3:
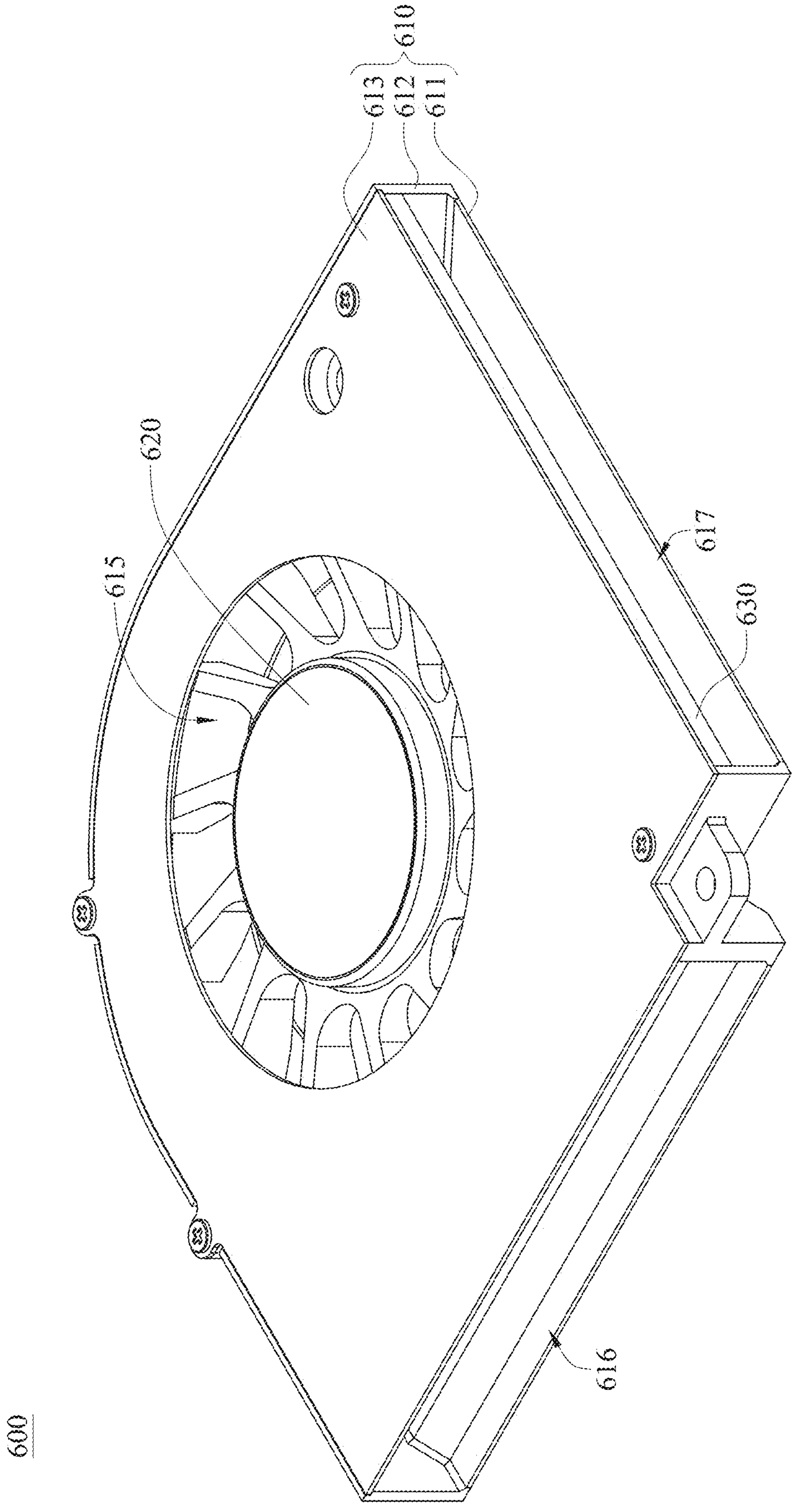
FIG. 3 is a perspective view of a first fan assembly of the heat dissipation assembly in FIG. 2.
Figure 4:
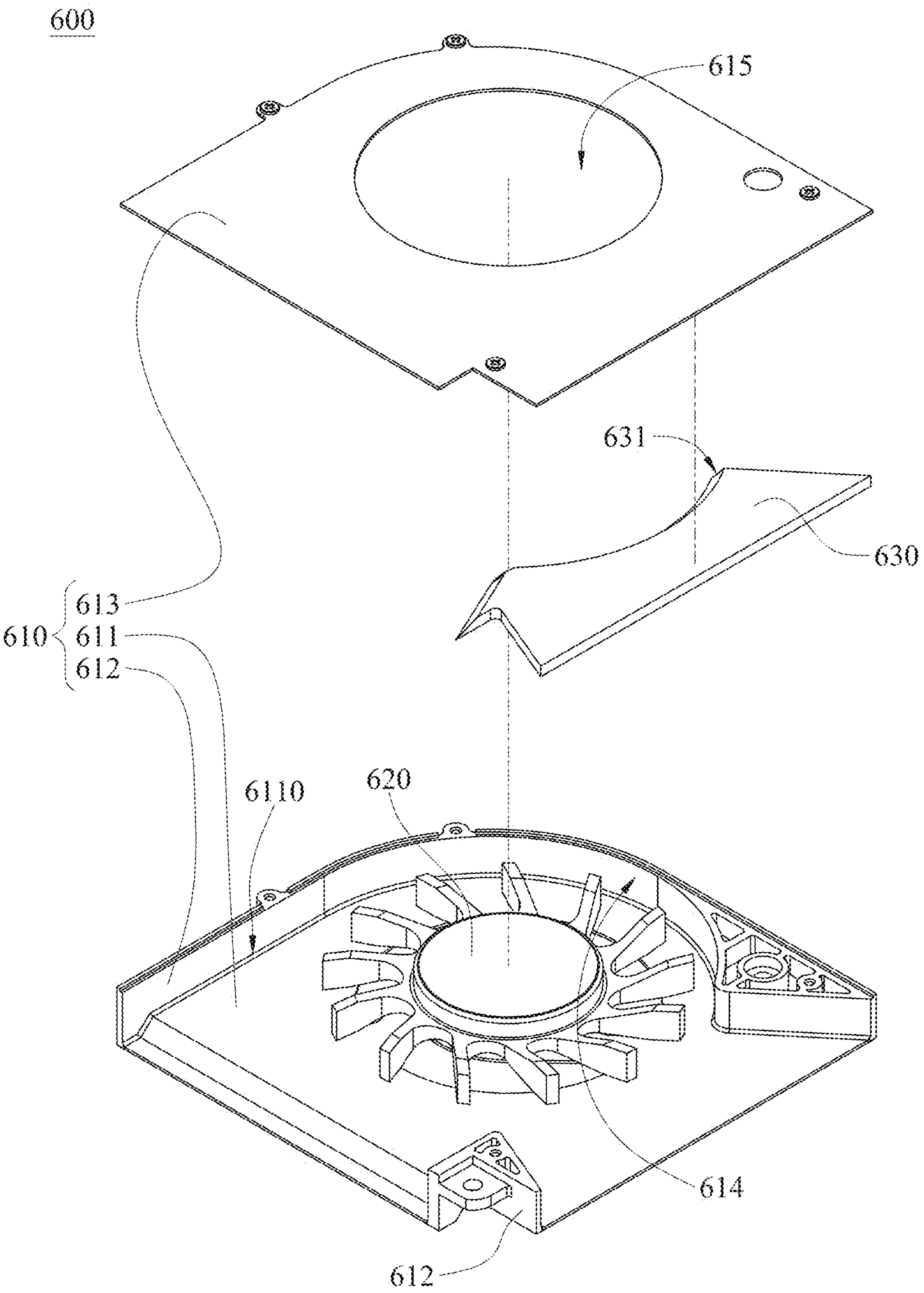
FIG. 4 is an exploded view of the first fan assembly in FIG. 3.
Figure 5:
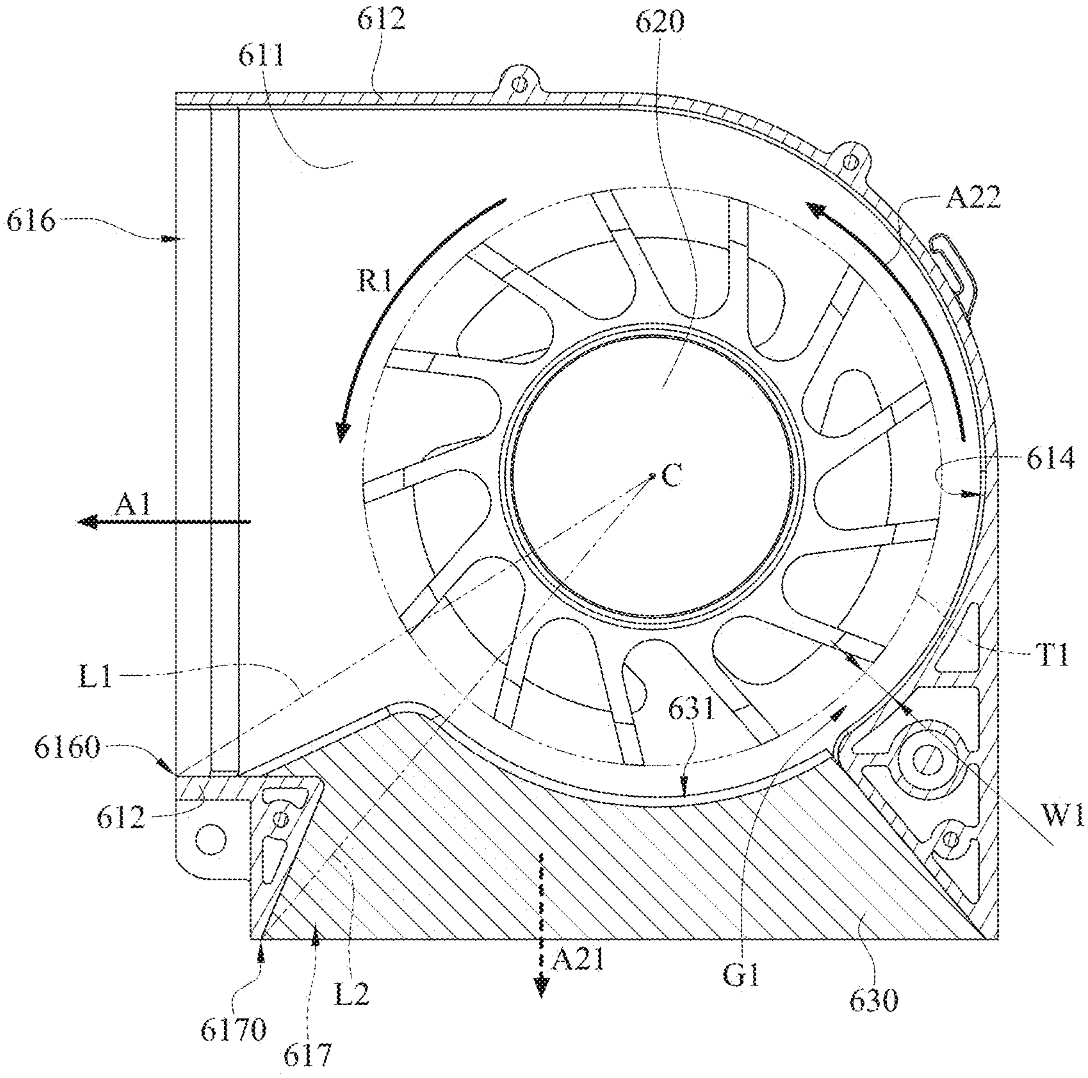
FIG. 5 is a top cross-sectional view of the first fan assembly in FIG. 3.

Please refer to FIGS. 3 to 5. FIG. 3 is a perspective view of the first fan assembly 600 of the heat dissipation assembly 300 in FIG. 2. FIG. 4 is an exploded view of the first fan assembly 600 in FIG. 3. FIG. 5 is a top cross-sectional view of the first fan assembly 600 in FIG. 3. The first fan assembly 600 includes a casing 610, an impeller 620 and an air collecting component 630.

The casing 610 includes a mounting plate 611, two side plates 612 and a cover plate 613, and has an inner surface 614, an inlet 615, a main outlet 616 and a secondary outlet 617. The two side plates 612 stand on an edge 6110 of the mounting plate 611, and are spaced apart from each other. The cover plate 613 is disposed on sides of the side plates 612 located away from the mounting plate 611. The inlet 615 is located on the cover plate 613. The mounting plate 611, the two side plates 612 and the cover plate 613 together form the main outlet 616 and the secondary outlet 617. Also, the main outlet 616 and the secondary outlet 617 are located on two different sides of the casing 610, respectively. The impeller 620 is configured to firstly blow an airflow A1 flowing toward the main outlet 616, and then blows an airflow A21 flowing toward the secondary outlet 617. The inner surface 614 is located on one of the two side plates 612. The inner surface 614 is connected to the main outlet 616 and the secondary outlet 617. The inlet 615 is in fluid communication with the main outlet 616 and the secondary outlet 617. In some embodiments, there may be multiple inlets 615. Note that in some embodiments, there may be multiple supporting plates (not shown) protruding outwards from the cover plate 613 to support the disturbing component 500 in FIG. 2.

The impeller 620 is rotatably disposed on the mounting plate 611. The inner surface 614 faces the impeller 620.

The air collecting component 630 is disposed in the secondary outlet 617, and has an air collecting surface 631. The air collecting surface 631 faces the impeller 620. The air collecting surface 631 is connected to the inner surface 614. The air collecting surface 631 and the inner surface 614 form a gap G1 together with an outline T1 of the impeller 620. The gap G1 is widened along a rotating direction R1 of the impeller 620. That is, a width W1 of the gap G1 is increased along the rotating direction R1 of the impeller 620. In other words, the gap G1 is in a spiral shape or a shape similar to that of a snail shell. The air collecting surface 631 of the air collecting component 630 is configured to change the flowing direction of the airflow A21 blown by the impeller 620 via the gap G1, so as to change the airflow A21 into an airflow A22 flowing towards the main outlet 616.

In this embodiment, the air collecting component 630 is, for example, adhered to the cover plate 613, but the disclosure is not limited thereto. In other embodiments, the air collecting component may be adhered to the mounting plate. In still other embodiments, the air collecting component and at least one of the cover plate, the mounting plate and the side plates may be integrally formed as a single piece. Further, in the embodiments where the air collecting component and the mounting plate are integrally formed as a single piece or adhered to each other, the air collecting component may be spaced apart from the cover plate; in the embodiments where the air collecting component and the side plates are integrally formed as a single piece, the air collecting component may be spaced apart from the cover plate and the mounting plate.

Moreover, in this embodiment, two opposite sides of the air collecting component 630 are in contact with the two side plates 612, respectively, but the disclosure is not limited thereto. In other embodiments, two opposite sides of the air collecting component may be spaced apart from the two side plates, respectively.

In addition, as shown in FIG. 5, a side of the air collecting surface 631 located away from the secondary outlet 617 is located between two connecting lines L1 and L2 between a rotation center C of the impeller 620 and adjacent edges 6160 and 6170 of the main outlet 616 and the secondary outlet 617. Thus, the air collecting surface 631 is allowed to smoothly guide the airflow A22 to the main outlet 616.

Figure 6:
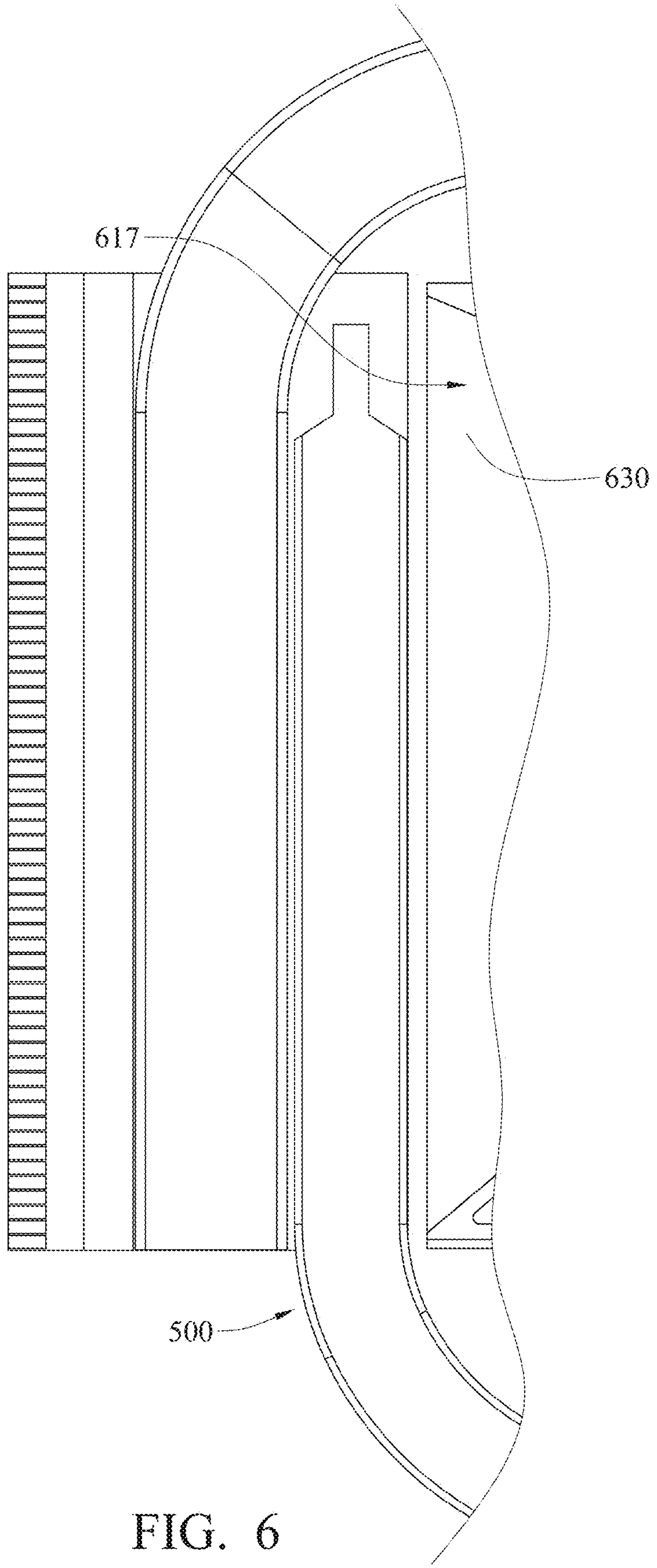
FIG. 6 is a partially enlarged bottom view of the heat dissipation assembly in FIG. 2 omitting a cover plate of the first fan assembly.

Please refer to FIG. 6. FIG. 6 is a partially enlarged bottom view of the heat dissipation assembly 300 in FIG. 2 omitting the cover plate 613 of the first fan assembly 600. The disturbing component 500 blocks at least a part of the secondary outlet 617 where the air collecting component 630 is disposed. Moreover, in this embodiment, the air collecting component 630 is spaced apart from the disturbing component 500. In some embodiments, the secondary outlet may be blocked by a fin, an electronic component or a structure of the housing. That is, in some embodiments, the disturbing component 500 may a fin, an electronic component or a structure of the housing.

Figure 7:
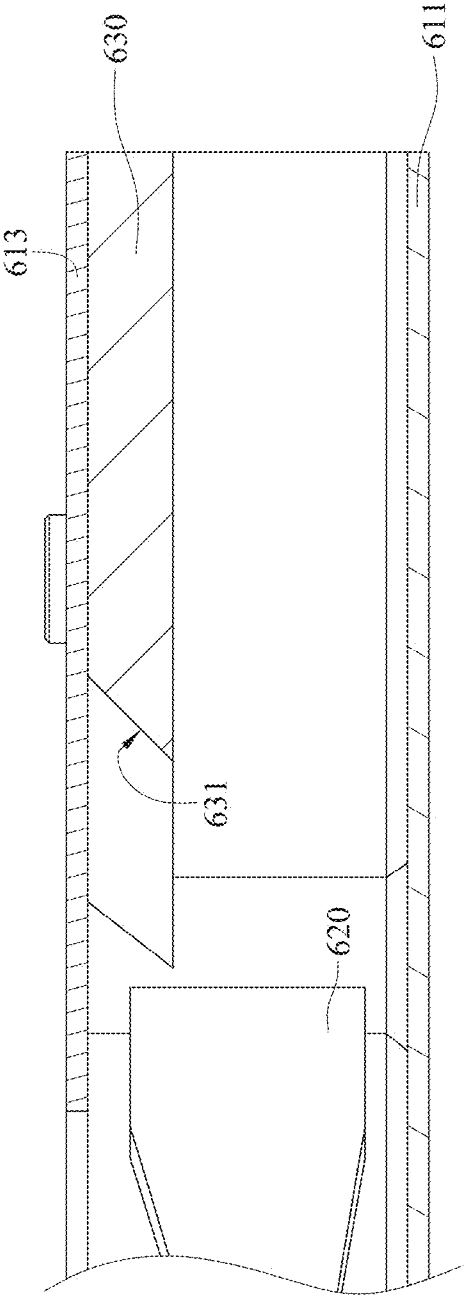
FIG. 7 is a partially enlarged side cross-sectional view of the first fan assembly in FIG. 3.

Please refer to FIG. 7. FIG. 7 is a partially enlarged side cross-sectional view of the first fan assembly 600 in FIG. 3. In addition, in this embodiment, the air collecting surface 631 is inclined, and a side of the air collecting surface 631 connected to the cover plate 613 is located farther away from the impeller 620 than a side of the air collecting surface 631 located away from the cover plate 613. Thus, the efficiency for the air collecting surface 631 to guide the airflow A22 towards the main outlet 616 is enhanced. However, the disclosure is not limited to the shape of the air collecting surface 631. In other embodiments, the side of the air collecting surface connected to the cover plate may be located closer to the impeller than the side of the air collecting surface located away from the cover plate; alternatively, for example, the air collecting surface may be a vertical surface, the air collecting surface may have an opposite inclination, or the air collecting surface may have a right-angled edge or a rounded edge.

Figure 8:
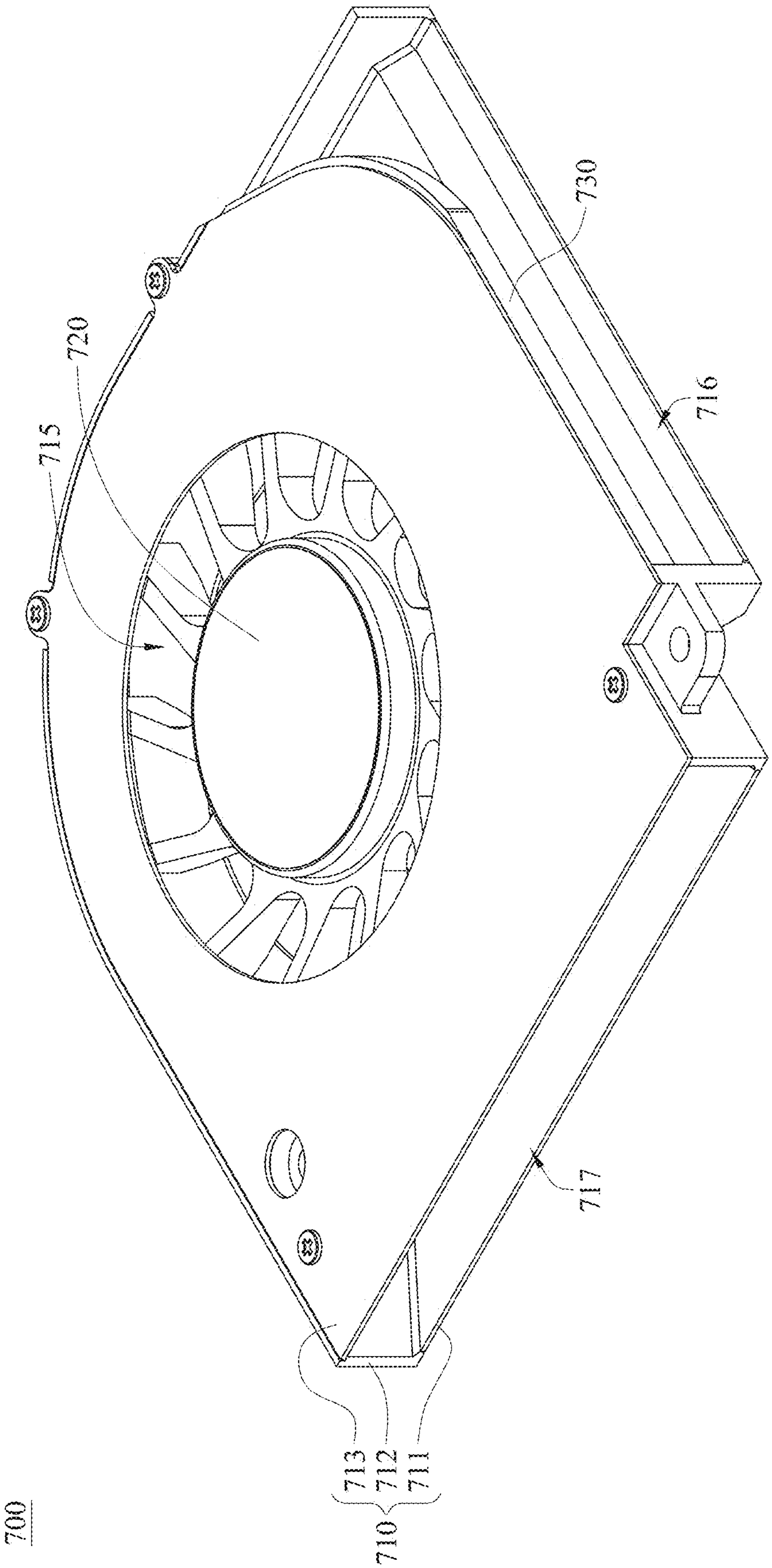
FIG. 8 is a perspective view of a second fan assembly of the heat dissipation assembly in FIG. 2.
Figure 9:
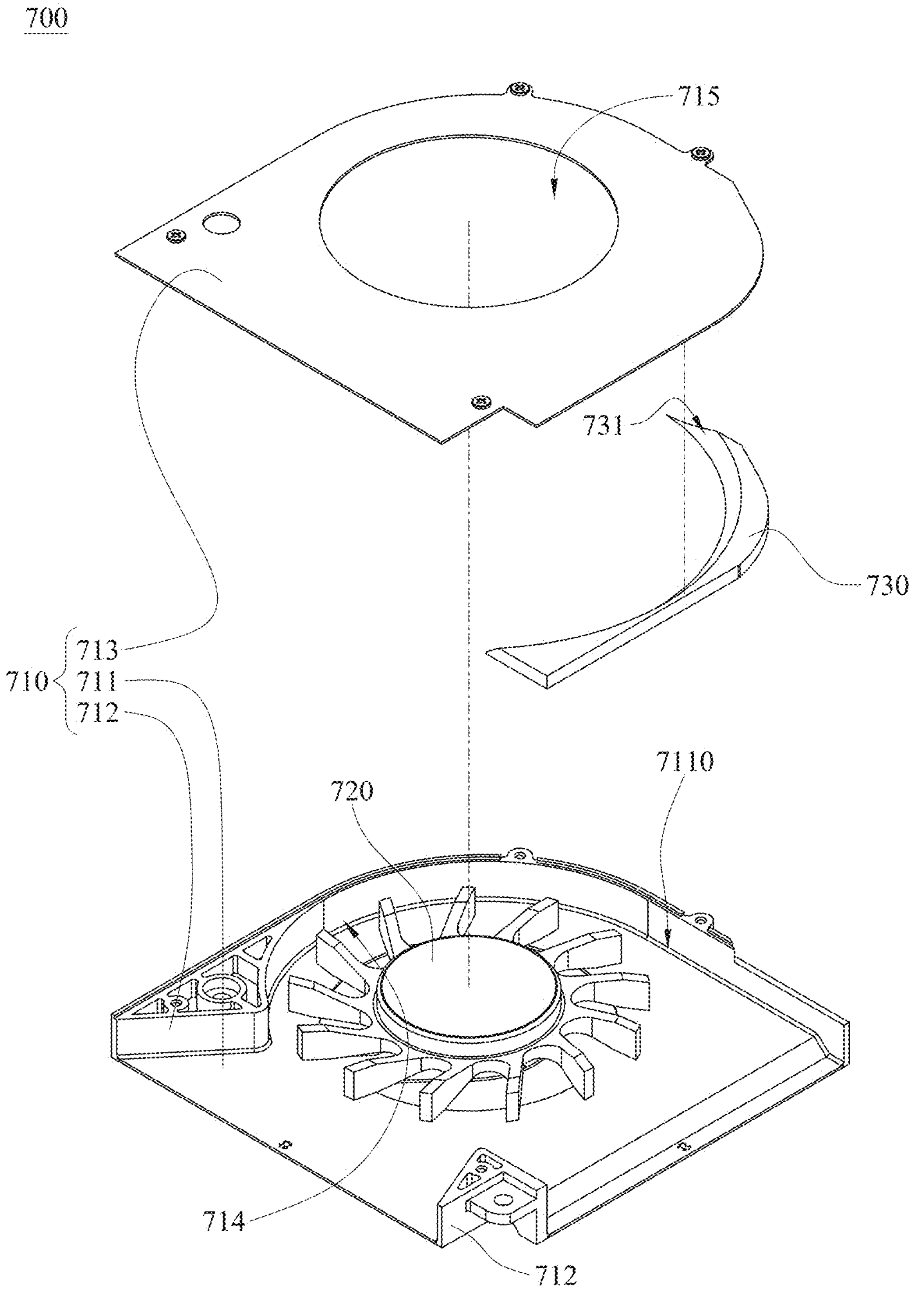
FIG. 9 is an exploded view of the second fan assembly in FIG. 8.
Figure 10:
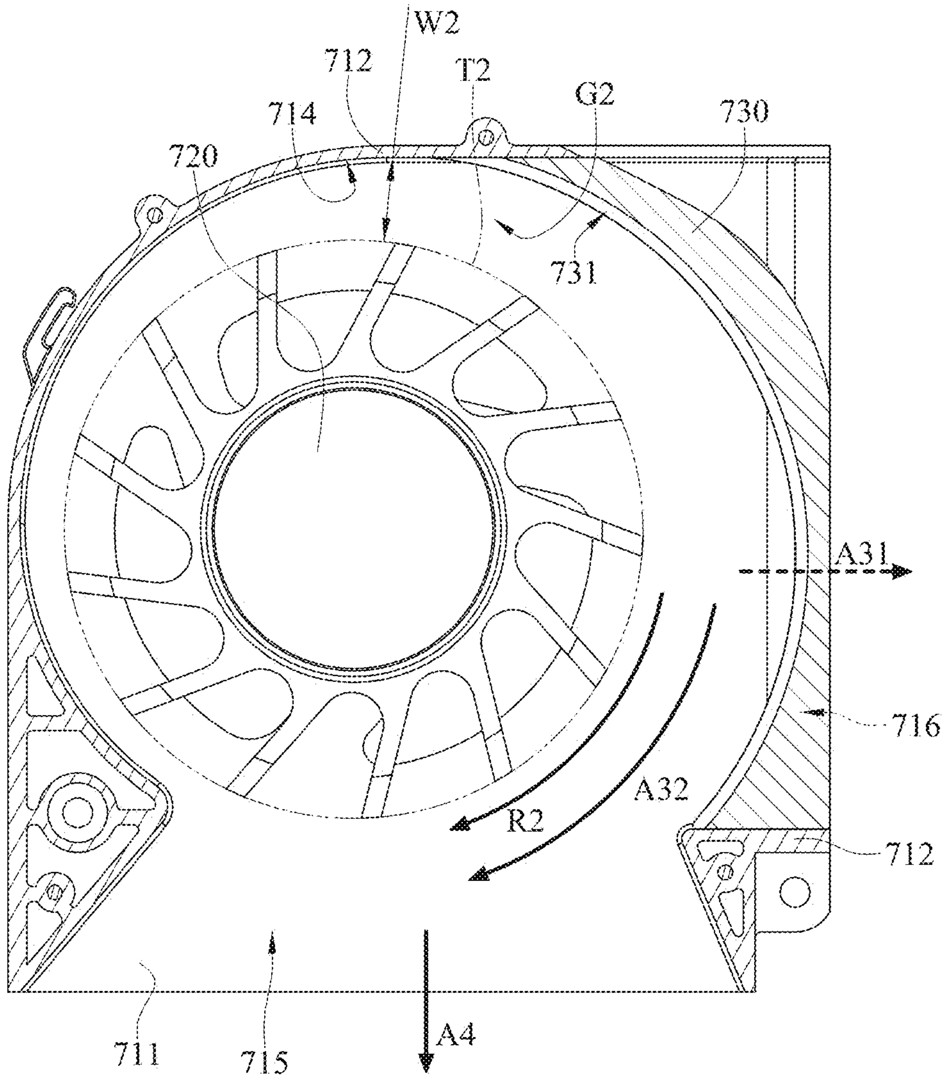
FIG. 10 is a top cross-sectional view of the second fan assembly in FIG. 8.

Please refer to FIGS. 8 to 10. FIG. 8 is a perspective view of the second fan assembly 700 of the heat dissipation assembly in FIG. 2. FIG. 9 is an exploded view of the second fan assembly 700 in FIG. 8. FIG. 10 is a top cross-sectional view of the second fan assembly 700 in FIG. 8. The second fan assembly 700 includes a casing 710, an impeller 720 and an air collecting component 730.

The casing 710 includes a mounting plate 711, two side plates 712 and a cover plate 713, and has an inner surface 714, an inlet 715, a main outlet 716 and a secondary outlet 717. The two side plates 712 stand on an edge 7110 of the mounting plate 711, and are spaced apart from each other. The cover plate 713 is disposed on sides of the side plates 712 located away from the mounting plate 711. The inlet 715 is located on the cover plate 713. The mounting plate 711, the two side plates 712 and the cover plate 713 together form the main outlet 716 and the secondary outlet 717. Also, the main outlet 716 and the secondary outlet 717 are located on two different sides of the casing 710, respectively. The impeller 720 is configured to firstly blow an airflow A31 flowing towards the main outlet 716, and then blows an airflow A4 flowing towards the secondary outlet 717. The inner surface 714 is located on one of the two side plates 712. The inner surface 714 is connected to the main outlet 716 and the secondary outlet 717. The inlet 715 is in fluid communication with the main outlet 716 and the secondary outlet 717.

The impeller 720 is rotatably disposed on the mounting plate 711. The inner surface 714 faces the impeller 720.

The air collecting component 730 is disposed in the main outlet 716, and has an air collecting surface 731. The air collecting surface 731 faces the impeller 720. The air collecting surface 731 is connected to the inner surface 714. The air collecting surface 731 and the inner surface 714 for a gap G2 together with an outline T2 of the impeller 720. The gap G2 is widened along a rotating direction R2 of the impeller 720. That is, a width W2 of the gap G2 is increased along the rotating direction R2 of the impeller 720. In other words, the gap G2 is in a spiral shape or a shape similar to the shape of a snail shell. The air collecting surface 731 of the air collecting component 730 is configured to change the flowing direction of the airflow A31 blown by the impeller 720 via the gap G2, so as to change the airflow A31 into an airflow A32 flowing towards the secondary outlet 717.

In this embodiment, the heat dissipation assembly 300 includes both of the first fan assembly 600 where the air collecting component 630 is disposed in the secondary outlet 617 and the second fan assembly 700 where the air collecting component 730 is disposed in the main outlet 716, but the disclosure is not limited thereto. In other embodiments, the heat dissipation assembly may merely include one fan assembly where the air collecting component is disposed in the secondary outlet or one fan assembly where the air collecting component is disposed in the main outlet, and the quantity of the heat source or the quantity of the heat sink may be correspondingly adjusted.

Please refer to FIG. 2 again. The two first heat sinks 400 are disposed adjacent to the main outlet 616 and the secondary outlet 617 of the first fan assembly 600, respectively. The two second heat sinks 450 are disposed adjacent to the main outlet 716 and the secondary outlet 717 of the second fan assembly 700, respectively.

In this embodiment, the heat dissipation assembly 300 may further include a third fan assembly 800 disposed adjacent to one of the second heat sinks 450. In other embodiments, the heat dissipation assembly may not include the third fan assembly.

Other embodiments are described below for illustrative purposes. It is to be noted that the following embodiments use the reference numerals and a part of the contents of the above embodiments, the same reference numerals are used to denote the same or similar elements, and the description of the same technical contents is omitted. For the description of the omitted part, reference may be made to the above embodiments, and details are not described in the following embodiments.

Figure 11:
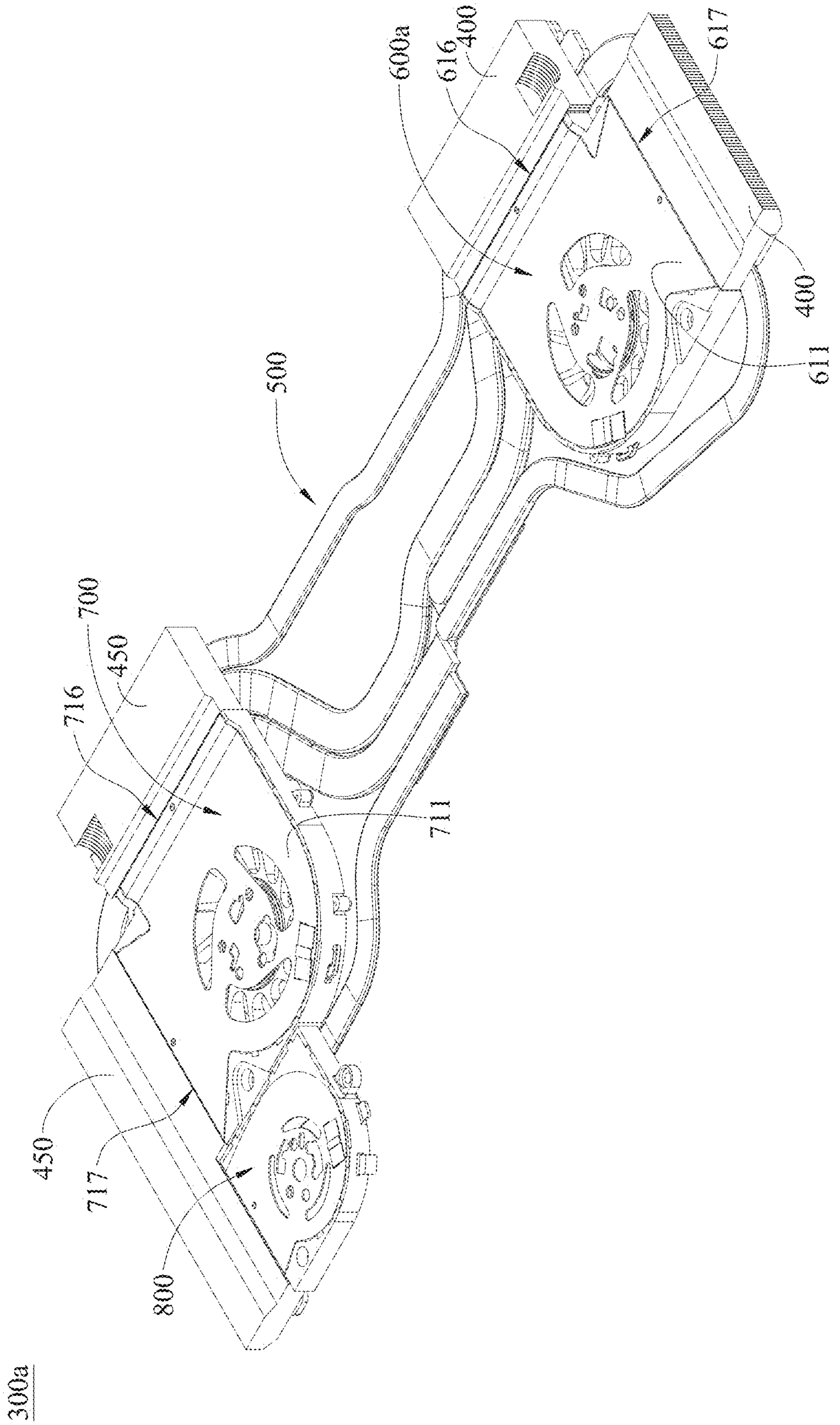
FIG. 11 is a perspective view of a heat dissipation assembly according to a second embodiment of the disclosure.
Figure 12:
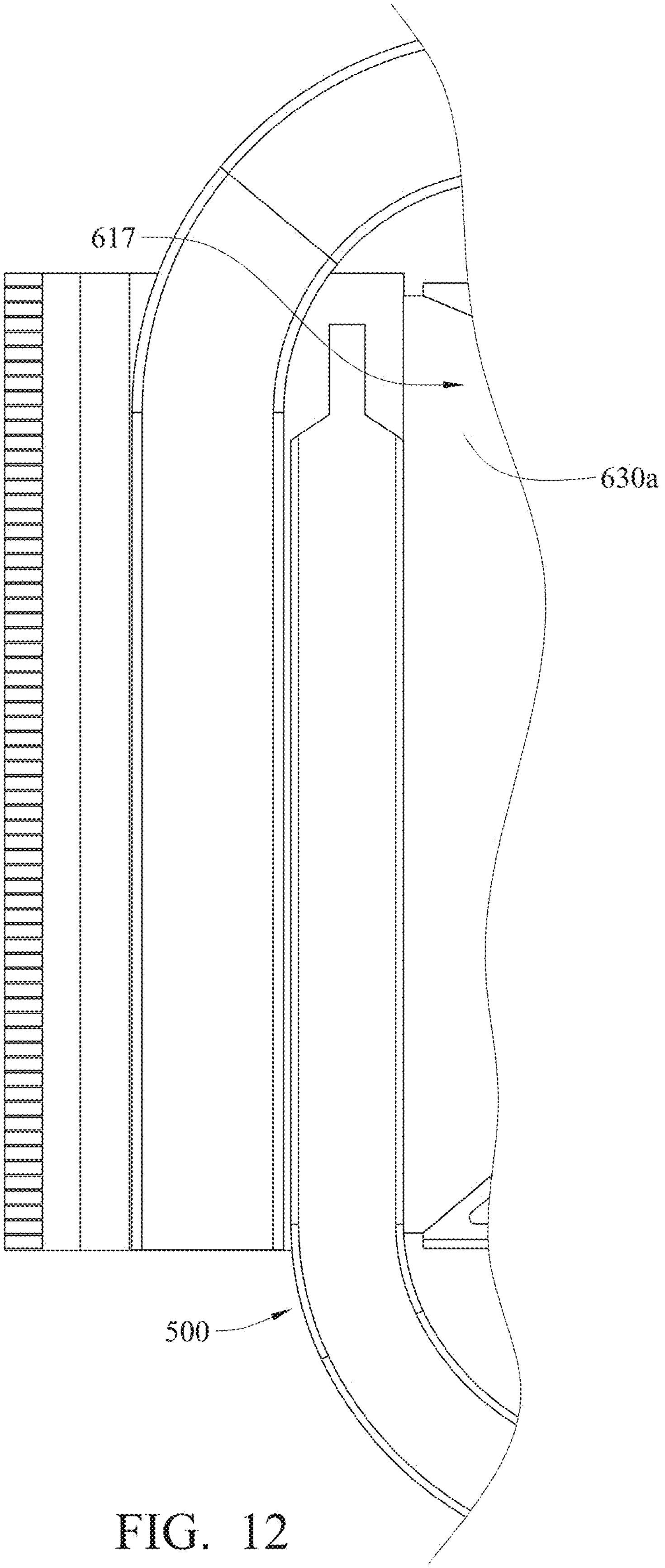
FIG. 12 is a partially enlarged bottom view of the heat dissipation assembly in FIG. 11 omitting a cover plate of a first fan assembly.

The disclosure is not limited to the relationship between the air collecting component and the disturbing component. Please refer to FIGS. 11 and 12. FIG. 11 is a perspective view of a heat dissipation assembly 300*a* according to a second embodiment of the disclosure. FIG. 12 is a partially enlarged bottom view of the heat dissipation assembly 300*a* in FIG. 11 omitting a cover plate 613 of a first fan assembly 600*a*. The only difference between the heat dissipation assembly 300*a* of this embodiment and the heat dissipation assembly 300 of the electronic device 10 of the first embodiment is in that an air collecting component 630*a* of the first fan assembly 600*a* of this embodiment is thermally coupled to the disturbing component 500. In detail, in this embodiment, the air collecting component 630*a* is, for example, a heat pipe assembly. The air collecting component 630*a* protrudes outwards from the secondary outlet 617, and is in thermal contact with the disturbing component 500. In this way, the air collecting component 630*a* facilitates the cooling of the disturbing component 500. In some embodiments, the air collecting component 630*a* may be thermally coupled to a heat sink or the housing. That is, in some embodiments, the air collecting component 630*a* may facilitate the cooling the disturbing component 500 that is a heat sink or the housing.

According to the fan assembly, the heat dissipation assembly and the electronic device disclosed by above embodiments, since the gap is widened along the rotating direction of the impeller, the air collecting component is allowed to guide the airflow blown by the impeller to another one of the at least two outlets via the gap as much as possible. Accordingly, in a case that the outlet for disposing the air collecting component is inevitably blocked by an adjacent component such as the disturbing component, the air collecting component guides the airflow that is originally blocked by the disturbing component to another outlet as much as possible, thereby maintaining the cooling efficiency of the fan assembly at its original level as much as possible.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A fan assembly, comprising: a casing, having an inner surface, an inlet and at least two outlets, wherein the inner surface is connected to the at least two outlets, and the inlet is in fluid communication with the at least two outlets; an impeller, rotatably disposed on the casing, wherein the inner surface faces the impeller; and an air collecting component entirely disposed in one of the at least two outlets and having an air collecting surface, wherein the air collecting surface faces the impeller, the air collecting surface is connected to the inner surface, the air collecting surface and the inner surface form a gap together with the impeller, the gap is gradually widened along a rotating direction of the impeller from a side of the air collecting surface opposite to the inner surface to a side of the inner surface opposite to the air collecting surface, and the air collecting component is configured to guide an airflow blown by the impeller to another one of the at least two outlets via the gap.

2. The fan assembly according to claim 1, wherein the at least two outlets comprise a main outlet and a secondary outlet, the main outlet and the secondary outlet are located on two different sides of the casing, respectively, and the air collecting component is disposed in the secondary outlet.

3. The fan assembly according to claim 1, wherein the at least two outlets comprise a main outlet and a secondary outlet, the main outlet and the secondary outlet are located on two different sides of the casing, respectively, and the air collecting component is disposed in the main outlet.

4. The fan assembly according to claim 1, wherein a side of the air collecting surface located away from the outlet where the air collecting component is disposed is located between two connecting lines between a rotation center of the impeller and adjacent edges of the at least two outlets.

5. The fan assembly according to claim 1, wherein the casing comprises a mounting plate, a side plate and a cover plate, the side plate stands on an edge of the mounting plate, the cover plate is disposed on a side of the side plate located away from the mounting plate, the inlet is located on the cover plate, the mounting plate, the side plate and the cover plate together form the at least two outlets, and the inner surface is located on the side plate.

6. The fan assembly according to claim 5, wherein the air collecting component and at least one of the cover plate, the mounting plate and the side plate are integrally formed as a single piece.

7. The fan assembly according to claim 5, wherein the air collecting component is adhered to the cover plate or the mounting plate.

8. A heat dissipation assembly, comprising: a fan assembly, comprising: a casing, having an inner surface, an inlet and at least two outlets, wherein the inner surface is connected to the at least two outlets, and the inlet is in fluid communication with the at least two outlets; an impeller, rotatably disposed on the casing, wherein the inner surface faces the impeller; and an air collecting component entirely disposed in one of the at least two outlets and having an air collecting surface, wherein the air collecting surface faces the impeller, the air collecting surface is connected to the inner surface, the air collecting surface and the inner surface form a gap together with the impeller, the gap is gradually widened along a rotating direction of the impeller from a side of the air collecting surface opposite to the inner surface to a side of the inner surface opposite to the air collecting surface, and the air collecting component is configured to guide an airflow blown by the impeller to another one of the at least two outlets via the gap; at least one heat sink, disposed adjacent to one of the at least two outlets; and a disturbing component, covering at least a part of the outlet where the air collecting component is disposed.

9. The heat dissipation assembly according to claim 8, wherein the disturbing component is a heat pipe assembly and thermally coupled to the at least one heat sink, and the air collecting component is thermally coupled to the disturbing component.

10. An electronic device, comprising: a housing; a motherboard assembly, comprising a motherboard and at least one heat source, wherein the motherboard is disposed in the housing, and the heat source is disposed on the motherboard; a fan assembly, disposed in the housing and comprising: a casing, having an inner surface, an inlet and at least two outlets, wherein the inner surface is connected to the at least two outlets, and the inlet is in fluid communication with the at least two outlets; an impeller, rotatably disposed on the casing, wherein the inner surface faces the impeller; and an air collecting component entirely disposed in one of the at least two outlets and having an air collecting surface, wherein the air collecting surface faces the impeller, the air collecting surface is connected to the inner surface, the air collecting surface and the inner surface form a gap together with the impeller, the gap is gradually widened along a rotating direction of the impeller from a side of the air collecting surface opposite to the inner surface to a side of the inner surface opposite to the air collecting surface, and the air collecting component is configured to guide an airflow blown by the impeller to another one of the at least two outlets via the gap; at least one heat sink, disposed in the housing and disposed adjacent to one of the at least two outlets; and a disturbing component, disposed in the housing and covering at least a part of the outlet where the air collecting component is disposed.

* * * * *